United States Patent
Schmid et al.

(10) Patent No.: US 10,821,836 B2
(45) Date of Patent: Nov. 3, 2020

(54) HIGH-VOLTAGE BATTERY DIVISION FOR CHARGING COLUMN CONNECTION

(71) Applicant: Dr. Ing. h.c. F. Porsche Aktiengesellschaft, Stuttgart (DE)

(72) Inventors: Thomas Schmid, Markgröningen (DE); Leo Spiegel, Vaihingen/Enz (DE); Pascal Heusler, Stuttgart (DE); Naser Abu Daqqa, Vaihingen an der Enz (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 71 days.

(21) Appl. No.: 16/025,107

(22) Filed: Jul. 2, 2018

(65) Prior Publication Data

US 2019/0009685 A1   Jan. 10, 2019

(30) Foreign Application Priority Data

Jul. 5, 2017   (DE) .................. 10 2017 114 988

(51) Int. Cl.
| | |
|---|---|
| *H01L 23/473* | (2006.01) |
| *H02J 7/00* | (2006.01) |
| *B60L 11/18* | (2006.01) |
| *B60L 53/31* | (2019.01) |
| *B60L 58/21* | (2019.01) |
| *B60L 58/19* | (2019.01) |

(52) U.S. Cl.
CPC .......... *B60L 11/1855* (2013.01); *B60L 53/31* (2019.02); *B60L 58/19* (2019.02); *B60L 58/21* (2019.02); *H01L 23/473* (2013.01); *H02J 7/0024* (2013.01); *B60L 2210/40* (2013.01)

(58) Field of Classification Search
None
See application file for complete search history.

(56) References Cited

U.S. PATENT DOCUMENTS

| | | | | |
|---|---|---|---|---|
| 8,818,648 | B2 * | 8/2014 | Takanashi | ............... E02F 9/268 701/50 |
| 2007/0107767 | A1 * | 5/2007 | Hayden | .................. H02J 7/0063 136/244 |
| 2012/0013303 | A1 | 1/2012 | Mera | |
| 2013/0106357 | A1 | 5/2013 | Girard et al. | |
| 2013/0300370 | A1 * | 11/2013 | Hotta | .................. H01M 10/425 320/117 |
| 2018/0109122 | A1 * | 4/2018 | Koerner | ............. H01M 10/441 |

FOREIGN PATENT DOCUMENTS

DE   102013102576 A1   9/2014

* cited by examiner

*Primary Examiner* — David V Henze-Gongola
(74) *Attorney, Agent, or Firm* — RatnerPrestia

(57) ABSTRACT

A method for the switched division of a high-voltage battery of a vehicle, which, for the purpose of charging the high-voltage battery, is connected to a charging column supplying a charging voltage of a specific voltage level, wherein the voltage level of the high-voltage battery results from a number M of series-connected modules of the same rated voltage, wherein the voltage level of the high-voltage battery corresponds to an integer multiple N of the voltage level of the charging voltage of the charging column, wherein the high-voltage battery is subdivided into N parallel-interconnected segments consisting of an equal number of modules by means of a first switch position of a number of power semiconductors.

9 Claims, 1 Drawing Sheet

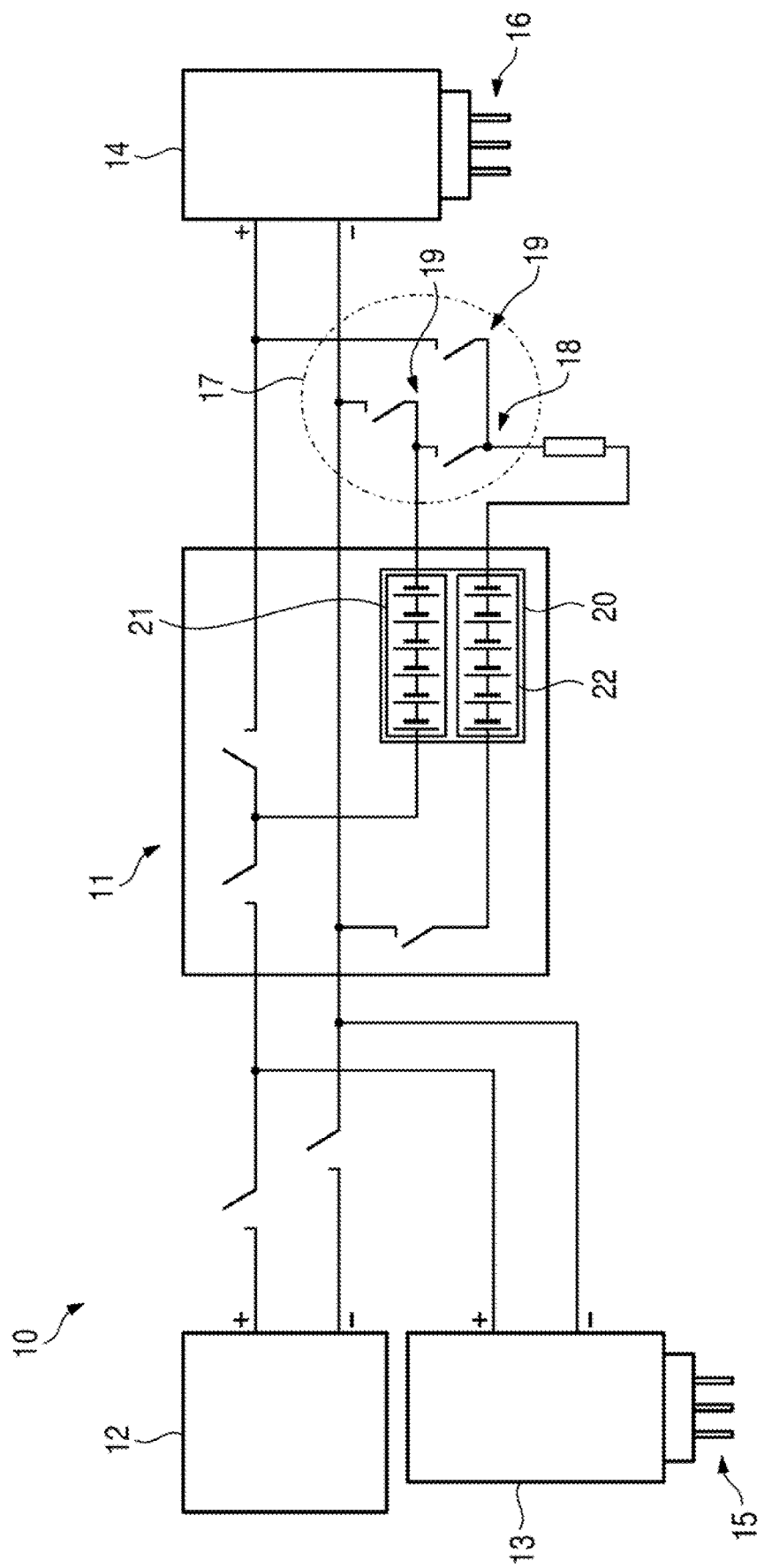

HIGH-VOLTAGE BATTERY DIVISION FOR CHARGING COLUMN CONNECTION

CROSS-REFERENCE TO RELATED APPLICATION

This application claims priority to German Patent Application No. DE 10 2017 114 988.0, filed Jul. 5, 2017, which is incorporated by reference herein in its entirety.

FIELD OF THE INVENTION

The present invention relates to a method and a system for the switched division of a high-voltage battery of a vehicle, which, for the purpose of charging the high-voltage battery, is connected to a charging column. A vehicle that uses the method and the system is also claimed.

BACKGROUND OF THE INVENTION

Electric vehicles, including electric hybrid vehicles and battery-electric vehicles, that are customary nowadays have a drive voltage of up to 400 V. A high-voltage battery carried in the vehicle as an energy supply, without restricting the generality, generally a battery in the form of a certain number of series-connected secondary cells, is accordingly dimensioned for this voltage level. Charging columns that are accessible in a public space also provide a charging voltage of 400 V as standard. In contrast, electric commercial vehicles, sports cars and racing cars are generally advantageously operated at voltages of, for example, 800 V or even 1200 V in order to supply a required drive power of more than 250 kilowatts. In order to save weight by switching systems that would first have to raise an on-board voltage to such a level, it is advantageous to operate a high-voltage battery in this voltage range as well. However, this would in turn necessitate switching systems that step up the voltage of 400 V provided by the charging columns to the voltage of the high-voltage battery.

The prior art makes it possible to supply a desired voltage level, for example of the high-voltage battery at 800 V, from a prescribed voltage level, for example of the charging column at 400 V, using voltage converters and, in particular, DC/DC converters, so-called DC/DC boosters. In addition to losses of efficiency, however, such electronic components have a comparatively high weight, high production costs and a large space requirement. Furthermore, there is the option in the prior art to connect in parallel the secondary cells of a battery in a plurality of groups, down to the actuation of an individual cell. The voltage level is therefore lower than if it were generated from a total voltage of all the series-connected secondary cells. Such a method is disclosed in document US 2013 0106 357 A1, in which a discharge state of a respective group of secondary cells is used to control a further discharge process or charging process by means of a contactor. In this case, each group requires one contactor, a likewise comparatively large and heavy electronic component.

In document US 2012 0013 303 A1, which is incorporated by reference herein, the subdivision of a battery into suitable groups of secondary elements based on an available charging current is carried out by a charging control unit, which in turn results in a parallel circuit of the groups and the use of electronic components having the aforementioned disadvantages.

Document DE 10 2013 102 576 A1, which is incorporated by reference herein, from the applicant itself, which invokes the advantages of a multiple charging connection, should be mentioned. Explicitly in the case of a high-voltage battery of 800 V, it is therefore possible to carry out a charging process more quickly using two charging connections of 400 V; however, there also has to be two charging columns available for this.

SUMMARY OF THE INVENTION

Against this background, it is an object of the present invention to provide a method for charging a high-voltage battery at a charging column having a lower charging voltage than the operating voltage of the high-voltage battery without making it necessary to install complex power electronics components here. It is also an object of the present invention to provide a corresponding system for carrying out such a method and to provide a vehicle that uses the method and the system.

To achieve the aforementioned object, a method for the switched division of a high-voltage battery of a vehicle is claimed, wherein, for the purpose of charging the high-voltage battery, the vehicle is connected to a charging column supplying a charging voltage of a specific voltage level, wherein the voltage level of the high-voltage battery results from a number M of series-connected modules of the same rated voltage, wherein the voltage level of the high-voltage battery corresponds to an integer multiple N of the voltage level of the charging voltage of the charging column, wherein the high-voltage battery is subdivided into N parallel-interconnected segments consisting of an equal number of (M/N) modules by means of a first switch position of a number of (3N−3) power semiconductors.

To create the first circuit, a parallel circuit of the N segments of the high-voltage battery, there is a power semiconductor between each of the N segments. This results in a total of (N−1) power semiconductors having an open switch position. At the same time, further (N−1) feed lines run from a positive pole of a first segment to (N−1) positive poles of the other (N−1) segments. Each of said (N−1) feed lines has a power semiconductor having a closed switch position. This results in a total of (N−1) further power semiconductors. Further (N−1) feed lines likewise run from a negative pole of a last segment to (N−1) negative poles of the remaining segments. Each of said (N−1) feed lines has a power semiconductor having an open switch position, which again results in (N−1) power semiconductors. To create a series circuit of the N segments of the high-voltage battery, ds the denoted power semiconductors assume a respective other switch position, as a result of which a second circuit is formed. To charge the high-voltage battery, the positive pole of the first segment is connected to the positive pole of the charging column and the negative pole of the last segment is connected to the negative pole of the charging column. Taken together, a total of three times (N−1), that is to say (3N−3), power semiconductors are used in the respective series or parallel circuit of the N segments.

In this case, 400 V can be mentioned as an example of a charging voltage of a charging column. If, for example, the high-voltage battery has a voltage level of 800 V, which corresponds to double the voltage level of the charging column, the high-voltage battery is subdivided into N=2 segments by means of (3N−3)=3 power semiconductors in accordance with the method according to aspects of the invention. In the case of the same charging voltage, the method according to aspects of the invention can be applied, for example, in the case of a high-voltage battery having a voltage level of 1200 V, which corresponds to triple the voltage level of the charging column. The high-voltage battery is subdivided into N=3 segments by means of (3N−3)=6 power semiconductors. Further implementations of the method according to aspects of the invention at other, for example lower, charging voltages, or even still higher voltage levels of the high-voltage battery, can be executed.

In one embodiment of the method according to aspects of the invention, the high-voltage battery is selected to have such a number M of modules that the number M results from a multiplication of the multiple N by a whole number. This advantageously achieves an equal total rated voltage and hence the same voltage level for the individual segments composed of the (M/N) modules.

In one embodiment of the method according to aspects of the invention, to terminate the charging, the high-voltage battery is switched to an operating state by means of the second switch position of the (3N−3) power semiconductors, said second switch position connecting the N segments in series. To this end, the vehicle is isolated from the charging column and is operationally ready, that is to say, for example, the full voltage level of the high-voltage battery is available to an electronic drive system.

In one embodiment of the method according to aspects of the invention, the power semiconductors are cooled. A charging current that flows through the closed (2N−2) power semiconductors leads to the development of heat in the respective power semiconductors. In the same way, heat can develop in the operating state in the (N−1) ds power semiconductors of the series circuit. To protect the power semiconductors, it is therefore advantageous to dissipate the heat that arises by way of a cooling system.

In yet another embodiment of the method according to aspects of the invention, the power semiconductors are cooled by means of a water cooling arrangement of the high-voltage battery. Since the high-voltage battery installed in the vehicle generally already has a cooling system, for example by way of a water circuit, the power semiconductors can advantageously be connected to this cooling system in direct proximity to the high-voltage battery.

A system for the switched division of a high-voltage battery of a vehicle is also claimed, which, for the purpose of charging the high-voltage battery, is connected to a charging column supplying a charging voltage of a specific voltage level, wherein the system comprises a high-voltage battery, the voltage level of which results from a number M of series-connected modules, wherein the voltage level of the high-voltage battery corresponds to an integer multiple N of the voltage level of the charging voltage of the charging column, and wherein the system has a number of (3N−3) power semiconductors configured to selectively assume a first or a second switch position, wherein the first switch position subdivides the high-voltage battery into N parallel-interconnected segments consisting of an equal number of (M/N) modules. A weight or dimension factor of the (3N−3) power semiconductors is in this case substantially lower than in electronic components used previously in the prior art.

In a further configuration of the system according to aspects of the invention, the high-voltage battery has such a number M of series-connected modules that a division of the multiple M by the multiple N of the voltage level of the charging voltage results in a whole number.

In a further configuration of the system according to aspects of the invention, the second switch position of the (3N−3) power semiconductors creates a series circuit of the N segments, said series circuit constituting an ready-to-drive operating state to terminate the charging.

In a further configuration, the system according to aspects of the invention also has a cooling arrangement of the power semiconductors. The water cooling arrangement that is usually already present in the high-voltage battery can be used for this purpose.

Finally, a vehicle fitted with the system according to aspects of the invention is claimed, said vehicle executing the method according to aspects of the invention.

BRIEF DESCRIPTION OF THE DRAWINGS

Further advantages and configurations of the invention emerge from the description and from the appended drawing.

It is self-evident that the features mentioned above and the features yet to be discussed below may be used not only in the respectively specified combination but also in other combinations or individually without departing from the scope of the present invention.

The FIGURE shows a schematic illustration of an exemplary circuit of a high-voltage battery divided in two by means of the method according to aspects of the invention.

DETAILED DESCRIPTION OF THE INVENTION

The FIGURE shows a schematic illustration of an exemplary circuit 10 of a high-voltage battery 11 divided in two by means of the method according to aspects of the invention. For a charging process, the modules 20 of the high-voltage battery 11 are subdivided into two segments 21 and 22 and connected to a charging column 12 by the circuit 17. To this end, one power switch 18 is opened and the two power switches 19 are closed. To terminate the charging, the high-voltage battery 11 is isolated from the charging column 12 and connected in series by opening the two power switches 19 and closing the power switch 18. This constitutes a ready-to-drive operating state in which a respective AC voltage at a respective connector 15 and 16 is available at a front inverter 13 and at a rear inverter 14. If a cooling arrangement, for example a water cooling arrangement, is present in the high-voltage battery 11, the circuit 17 can advantageously be installed in direct proximity to the high-voltage battery 11, where applicable within a housing of the high-voltage battery 11.

What is claimed is:

1. A method for the switched division of a high-voltage battery of a vehicle, which, for the purpose of charging the high-voltage battery, comprising the steps of:
  connecting the high-voltage battery of the vehicle to a charging column supplying a charging voltage of a specific voltage level, wherein a voltage level of the high-voltage battery results from a number M of series-connected modules of the same rated voltage, wherein the voltage level of the high-voltage battery corresponds to an integer multiple N of the voltage level of the charging voltage of the charging column, and
  subdividing the high-voltage battery of the vehicle into N parallel-interconnected segments each having an equal number of modules by means of a first switch position of a number 3N−3 of power semiconductors, the 3N−3 power semiconductors consisting of:
    (N−1) power semiconductors connected between each of the N segments;
    (N−1) power semiconductors connected in respective (N−1) first feed lines running from a positive pole of a first one of the N segments to (N−1) positive poles of remaining (N−1) ones of the N segments; and (N−1) power semiconductors connected in respective (N−1) second feed lines running from a negative pole of a last one of the N segments to (N−1) negative poles of remaining (N−1) ones of the N segments, wherein each of the 3N−3 power semiconductors having a closed state in which current flows through the power semiconductor and an open state in which no current flows through the power semiconductor; and connecting the N segments in series to terminate the charging by switching the high-voltage battery to an operating state by a second switch position of the power semiconductors, the second switch position being a position in which each of the 3N−3 power semiconductors power semiconductors is switched to different state from the first switch position.

2. The method as claimed in claim 1, wherein the high-voltage battery has a number M of modules that results from a multiplication of the multiple N by a whole number.

3. The method as claimed in claim 1, further comprises the step of:

cooling the power semiconductors.

4. The method as claimed in claim 3, wherein the power semiconductors are cooled by a water cooling arrangement of the high-voltage battery.

5. A system for the switched division of a high-voltage battery of a vehicle, for the purpose of charging the high-voltage battery when a charging column supplying a charging voltage of a specific voltage level, the system comprising:

a high-voltage battery, the voltage level of which results from a number M of series-connected modules, wherein the voltage level of the high-voltage battery corresponds to an integer multiple N of the voltage level of the charging voltage of the charging column, and a number 3N−3 of power semiconductors configured to selectively assume a first or a second switch position, wherein the first switch position subdivides the high-voltage battery into N parallel-interconnected segments each having an equal number of modules, the 3N−3 power semiconductors consisting of:

(N−1) power semiconductors connected between each of the N segments;

(N−1) power semiconductors connected in respective (N−1) first feed lines running from a positive pole of a first one of the N segments to (N−1) positive poles of remaining (N−1) ones of the N segments; and (N−1) power semiconductors connected in respective (N−1) second feed lines running from a negative pole of a last one of the N segments to (N−1) negative poles of remaining (N−1) ones of the N segments, wherein each of the 3N−3 power semiconductors having a closed state in which current flows through the power semiconductor and an open state in which no current flows through the power semiconductor; and wherein the N segments are connected in series to terminate the charging by switching the high-voltage battery to an operating state by a second switch position of the power semiconductors, the second switch position being a position in which each of the 3N−3 power semiconductors power semiconductors is switched to different state from the first switch position.

6. The system as claimed in claim 5, wherein a division of the number M of series-connected modules by the multiple N of the voltage level of the charging voltage results in a whole number.

7. The system as claimed in claim 5, wherein the second switch position of the power semiconductors creates a series circuit of the N segments, said series circuit being an operating state that terminates the charging.

8. The system as claimed in claim 5, further comprising:

a cooling arrangement for the power semiconductors.

9. A vehicle comprising:

a system for the switched division of a high-voltage battery of the vehicle, for the purpose of charging the high-voltage battery when a charging column supplying a charging voltage of a specific voltage level, the system comprising:

a high-voltage battery, the voltage level of which results from a number M of series-connected modules, wherein the voltage level of the high-voltage battery corresponds to an integer multiple N of the voltage level of the charging voltage of the charging column, and a number 3N−3 of power semiconductors configured to selectively assume a first or a second switch position, wherein the first switch position subdivides the high-voltage battery into N parallel-interconnected segments each having an equal number of modules, the 3N−3 power semiconductors consisting of:

(N−1) power semiconductors connected between each of the N segments;

(N−1) power semiconductors connected in respective (N−1) first feed lines running from a positive pole of a first one of the N segments to (N−1) positive poles of remaining (N−1) ones of the N segments; and (N−1) power semiconductors connected in respective (N−1) second feed lines running from a negative pole of a last one of the N segments to (N−1) negative poles of remaining (N−1) ones of the N segments, wherein each of the 3N−3 power semiconductors having a closed state in which current flows through the power semiconductor and an open state in which no current flows through the power semiconductor; and wherein the N segments are connected in series to terminate the charging by switching the high-voltage battery to an operating state by a second switch position of the power semiconductors, the second switch position being a position in which each of the 3N−3 power semiconductors power semiconductors is switched to different state from the first switch position.

* * * * *